United States Patent
Butenhoff et al.

(10) Patent No.: US 10,615,779 B1
(45) Date of Patent: Apr. 7, 2020

(54) ADAPTIVE THRESHOLD CONTROL SYSTEM FOR DETECTING AND ADJUSTING THE DURATION OF REGIONS OF OPERATION DURING TRANSISTOR TURN ON AND TURN OFF

(71) Applicant: TEXAS INSTRUMENTS INCORPORATED, Dallas, TX (US)

(72) Inventors: Michael Edwin Butenhoff, Minnesota City, MN (US); Rakesh Raja, Allen, TX (US); Sudhir Nagaraj, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/449,025

(22) Filed: Jun. 21, 2019

(51) Int. Cl.
H03K 3/011 (2006.01)
H03K 3/012 (2006.01)
H03K 5/24 (2006.01)
H03K 17/04 (2006.01)

(52) U.S. Cl.
CPC ............. *H03K 3/011* (2013.01); *H03K 3/012* (2013.01); *H03K 5/24* (2013.01); *H03K 17/04* (2013.01)

(58) Field of Classification Search
None
See application file for complete search history.

(56) References Cited

U.S. PATENT DOCUMENTS 8,675,374 B2 * 3/2014 Coleman ............... H02M 3/158
363/21.03
10,469,057 B1 * 11/2019 Frank ..................... H03K 3/012

* cited by examiner

Primary Examiner — Jeffery S Zweizig
(74) Attorney, Agent, or Firm — John R. Pessetto; Charles A. Brill; Frank D. Cimino (57) ABSTRACT

A system comprises a buffer circuit coupled to a comparator, and an adaptive threshold control circuit coupled to a timer and comparator. Buffer circuit receives a first voltage across a control terminal and a first current terminal of a transistor and a second voltage across a second current terminal and the first current terminal of the transistor. Comparator compares first voltage to a first threshold, generating a first trigger signal when it crosses first threshold, and compares second voltage to a second threshold, generating a second trigger signal when it crosses second threshold. Timer determines length of time between trigger signals. Adaptive threshold control circuit generates a first control signal for first trigger signal, and a second control signal for second trigger signal, and provides a control signal to comparator indicative of whether length of time is greater than or less than user-programmed value, causing comparator to adjust first threshold.

21 Claims, 4 Drawing Sheets

ADAPTIVE THRESHOLD CONTROL SYSTEM FOR DETECTING AND ADJUSTING THE DURATION OF REGIONS OF OPERATION DURING TRANSISTOR TURN ON AND TURN OFF

BACKGROUND

H bridge drivers include two high side transistors and two low side transistors, and are configured such that each high side transistor is in series with a respective low side transistor and a load is coupled to the nodes between the pairs of high side and low side transistors. Each pair of high side and low side transistors is called a half-bridge. A gate driver circuit converts a control signal to a power signal that can efficiently turn on and off each transistor in the H bridge driver. To prevent shoot-through conditions within a half-bridge during transitions from high to low or low to high, dead time is inserted between turning off of one transistor and turning on of the other. The length of the dead time is often equal to the time required to turn on or turn off a transistor in the half-bridge driver. However, dead time limits the operating frequency of the H bridge driver and allows power dissipation through transistors in the H bridge driver.

Some gate driver circuits reduce power dissipation during dead time by turning the transistor on and off more quickly. This may increase the efficiency of the H bridge driver, but at the cost of creating electromagnetic interference (EMI) in the integrated circuit (IC), disrupting operation of other circuits in the IC. Some gate driver circuits balance the need for quick turn on and turn off times with controlled EMI by implementing comparators to detect different regions of operation for each transistor during turn on and turn off, and quickening only the regions that are unlikely to cause EMI. However, these comparators must be tuned for each transistor, system voltage, motor type, board parasitics, and the like, and often experience degrading performance over time as system parameters change, for example as temperature or the supply voltage changes.

SUMMARY

An adaptive threshold control system comprises a buffer circuit, a comparator circuit, a timer circuit, and an adaptive threshold control circuit. The buffer circuit is configured to be coupled to a transistor, such that the buffer circuit receives a first voltage across a control terminal and a first current terminal of the transistor and a second voltage across a second current terminal and the first current terminal of the transistor. The comparator circuit is coupled to the buffer circuit, and configured to compare the first voltage to a first threshold and generate a first trigger signal in response to the first voltage crossing the first threshold. The comparator circuit is further configured to compare the second voltage to a second threshold and generate a second trigger signal in response to the second voltage crossing the second threshold. The time circuit is configured to determine a length of time between the first and second trigger signals. The adaptive threshold control circuit is coupled to the comparator circuit and the timer circuit. The adaptive threshold control circuit is configured to generate a first control signal in response to the first trigger signal and a second control signal in response to the second trigger signal. The adaptive threshold control circuit is further configured to provide a third control signal to the comparator circuit. The third control signal is indicative of whether the length of time is greater than or less than a user-programmed value, and causes the comparator circuit to adjust the first threshold. In some implementations, the first and second control signals cause a gate driver circuit for the transistor to adjust a drive current.

For transistor turn on, the comparator circuit is configured to increase the first threshold in response to the third control signal indicating the length of time is greater than the user-programmed value, and decrease the first threshold in response to the third control signal indicating the length of time is less than the user-programmed value. For transistor turn on, the comparator circuit is configured to generate the first trigger signal in response to the first voltage increasing above the first threshold. In some implementations, the transistor is a low side transistor in a half-bridge circuit, and the comparator circuit is configured to generate the second trigger signal in response to the second voltage decreasing below the second threshold. In other implementations, the transistor is a high side transistor in a half-bridge circuit, and the comparator circuit is configured to generate the second trigger signal in response to the second voltage increasing above the second threshold.

For transistor turn off, the comparator circuit is configured to decrease the first threshold in response to the third control signal indicating the length of time is greater than the user-programmed value and increase the first threshold in response to the third control signal indicating the length of time is less than the user-programmed value. For transistor turn off, the comparator circuit is configured to generate the first trigger signal in response to the first voltage decreasing below the first threshold. In some implementations, the transistor is a low side transistor in a half-bridge circuit, and the comparator circuit is configured to generate the second trigger signal in response to the second voltage increasing above the second threshold. In other implementations, the transistor is a high side transistor in a half-bridge circuit, and the comparator circuit is configured to generate the second trigger signal in response to the second voltage decreasing below the second threshold.

BRIEF DESCRIPTION OF THE DRAWINGS

For a detailed description of various examples, reference will now be made to the accompanying drawings in which:

FIG. 4 shows the drain to source voltage of a low side transistor in an example H bridge motor driver, the drain current through the low side transistor, the gate to source voltage of the low side transistor, and the drive current applied to the gate of the low side transistor during transistor turn on.

FIG. 5 shows the drain to source voltage of a high side transistor in an example H bridge motor driver, the drain current through the high side transistor, the gate to source voltage of the high side transistor, and the drive current applied to the gate of the high side transistor during transistor turn on.

DETAILED DESCRIPTION

As noted above, gate driver circuits implementing comparators to detect different regions of operation during transistor turn on and turn off experience degrading performance over time as system parameters change, for example as temperature or the supply voltage changes. The disclosed circuits detect different regions of operation for transistors during turn on and turn off based on adjustable thresholds, which can be changed in response to changes in system parameters, such as temperature or supply voltage. The adjustable thresholds are adjusted in order to maintain a user-programmed length of time for a user-programmed drive current to be applied. This enables a user to tailor an H bridge driver's operation based on the particular EMI requirements of the implementation without compromising efficiency.

A disclosed example adjustable threshold control system includes a buffer circuit coupled to a transistor in the H bridge driver, such that the buffer circuit receives a gate to source voltage (Vgs) and a drain to source voltage (Vds) for the transistor. A comparator circuit coupled to the buffer circuit is configured to compare the Vgs to a first threshold and generate a first trigger signal in response to the Vgs crossing the first threshold. The comparator circuit is also configured to compare the Vds to a second threshold and generate a second trigger signal in response to the Vds crossing the second threshold. An adaptive threshold control circuit coupled to the comparator circuit generates a first control signal for a gate driver circuit in response to the first trigger signal and a second control signal for the gate driver circuit in response to the second trigger signal. The gate driver circuit adjusts the drive current based on the first and second control signals.

The adaptive threshold control circuit is also coupled to a timer circuit, which determines a length of time between the first trigger signal and the second trigger signal. The adaptive threshold control signal compares the length of time to a user-programmed value, and provides a third control signal to the comparator circuit in response to the length of time being greater than the user-programmed value and a fourth control signal to the comparator circuit in response to the length of time being less than the user-programmed value. The comparator circuit adjusts the first threshold based on the third and fourth control signals.

For transistor turn on, the comparator circuit increases the first threshold in response to the length of time being greater than the user-programmed value and decreases the first threshold in response to the length of time being less than the user-programmed value. The comparator circuit generates the first trigger signal in response to the Vgs increasing above the first threshold. If the transistor is a low side transistor in the H bridge driver, the comparator circuit generates the second trigger signal in response to the Vds decreasing below the second threshold. If the transistor is a high side transistor in the H bridge driver, the comparator circuit generates the second trigger signal in response to the Vds increasing above the second threshold.

For transistor turn off, the comparator circuit decreases the first threshold in response to the length of time being greater than the user-programmed value and increases the first threshold in response to the length of time being less than the user-programmed value. The comparator circuit generates the first trigger signal in response to the Vgs decreasing below the first threshold. If the transistor is a low side transistor in the H bridge driver, the comparator circuit generates the second trigger signal in response to the Vds increasing above the second threshold. If the transistor is a high side transistor in the H bridge driver, the comparator circuit generates the second trigger signal in response to the Vds decreasing below the second threshold.

Figure 1:
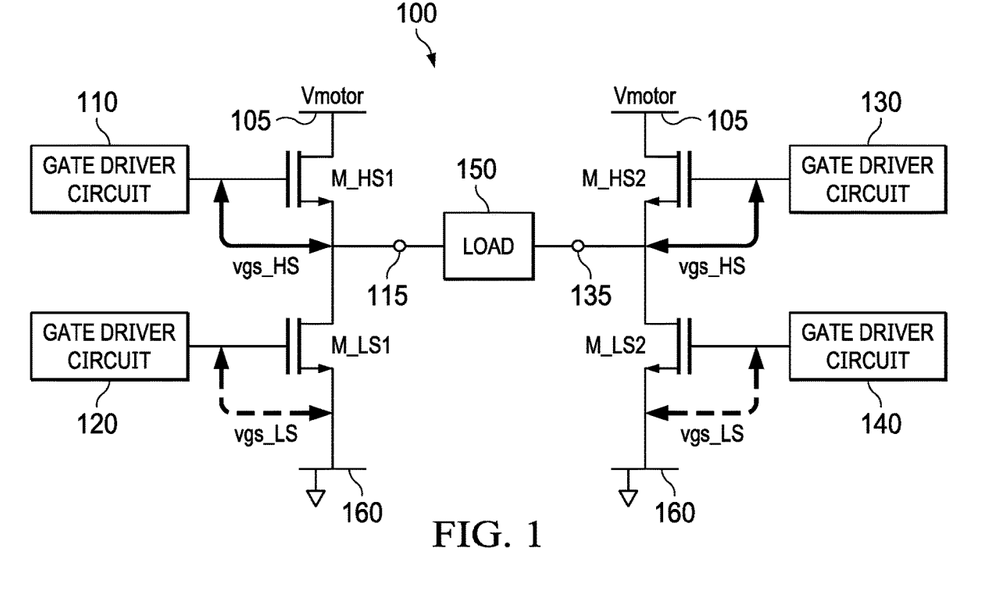
FIG. 1 illustrates an example H bridge motor driver.

FIG. 1 illustrates an example H bridge motor driver 100. Although FIG. 1 illustrates an H bridge implemented as a motor driver, H bridges and the gate driver circuits described herein can be used in a variety of applications, including other kinds of power electronics and the like. Example H bridge motor driver 100 includes high-side power field-effect transistors (FETs) M_HS1 and M_HS2 and low-side power FETs M_LS1 and M_LS2. A source terminal of M_HS1 is coupled to a drain terminal of M_LS1 at node 115, forming a half-bridge configuration. A source terminal of M_HS2 is coupled to a drain terminal of M_LS2 at node 135, forming another half-bridge configuration. The drain terminals of M_HS1 and M_HS2 are coupled to receive a supply voltage Vmotor at node 105. The source terminals of M_LS1 and M_LS2 are coupled to receive a common mode voltage at node 160. In some examples, the common mode voltage at node 160 is ground. Node 115 and node 135 form output nodes of the H bridge motor driver 100 and load 150 is coupled to nodes 115 and 135.

The gate terminals of each of M_HS1, M_LS1, M_HS2, and M_LS2 are coupled to respective gate driver circuits. The gate terminal of M_HS1 is coupled to receive a gate driving current from gate driver circuit 110. The gate terminal of M_LS1 is coupled to receive a gate driving current from gate driver circuit 120. The gate terminal of M_HS2 is coupled to receive a gate driving current from gate driver circuit 130. The gate terminal of M_LS2 is coupled to receive a gate driving current from gate driver circuit 140.

H bridge motor driver 100 includes metal oxide semiconductor field-effect transistors (MOSFETs). M_HS1, M_LS1, M_HS2, and M_LS2 are n-type MOSFETs (NMOS) in this example. In other examples, one or more of M_HS1, M_LS1, M_HS2, and M_LS2 are p-type MOSFETs (PMOS) or bipolar junction transistors. A bipolar junction transistor includes a base, a collector, and an emitter. The base of a bipolar junction transistor and the gate terminal of a MOSFET are also called control inputs or control terminals. The collector and emitter of a bipolar junction transistor and the drain and source terminals of a MOSFET are also called current terminals.

Figure 2:
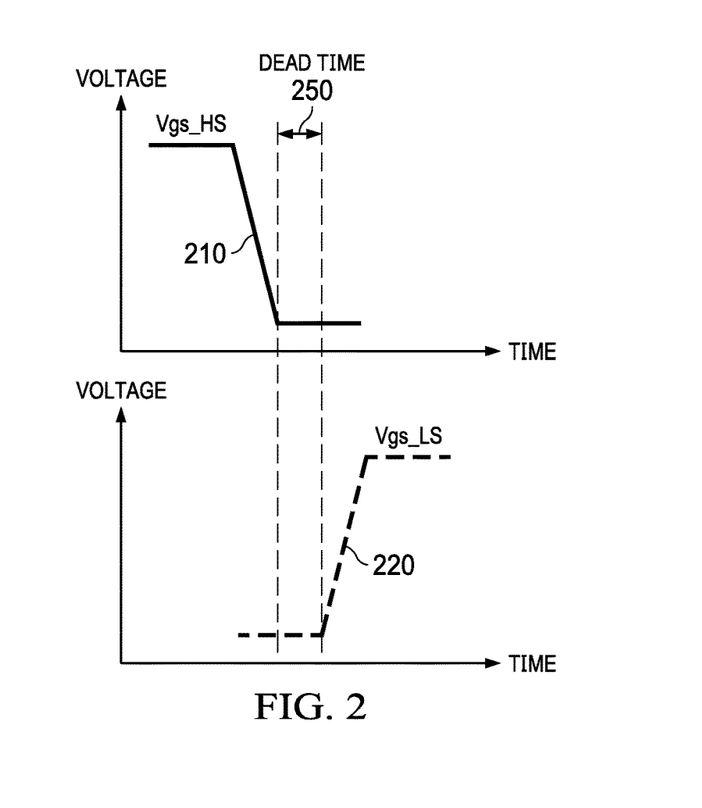
FIG. 2 shows the gate to source voltages of a high side transistor and a low side transistor in an example H bridge motor driver over time.

FIG. 2 shows the gate to source voltage Vgs_HS 210 of M_HS1 and the gate to source voltage Vgs_LS 220 of M_LS1 in example H bridge motor driver 100 over time. To prevent shoot-through current, the switching scheme controlling M_HS1 and M_LS1 includes a dead-time 250 in which neither the high side transistor M_HS1 nor the low side transistor M_LS1 are on. This ensures that M_HS1 is fully off before M_LS1 turns on. As discussed previously, dead-time 250 slows the switching frequency achievable by H bridge motor driver 100 and increases power dissipated through H bridge motor driver 100. To counter this, some motor drivers increase the slew rate, the speed at which the transistors turn on and off, reducing the propagation delay. Increasing the slew rate may also increase EMI and create noise that interferes with operation of other circuits within the IC. As EMI impacts operation of other circuits, some gate driver circuits prioritize the slew rate and EMI requirements of the IC over switching frequency.

Figure 3:
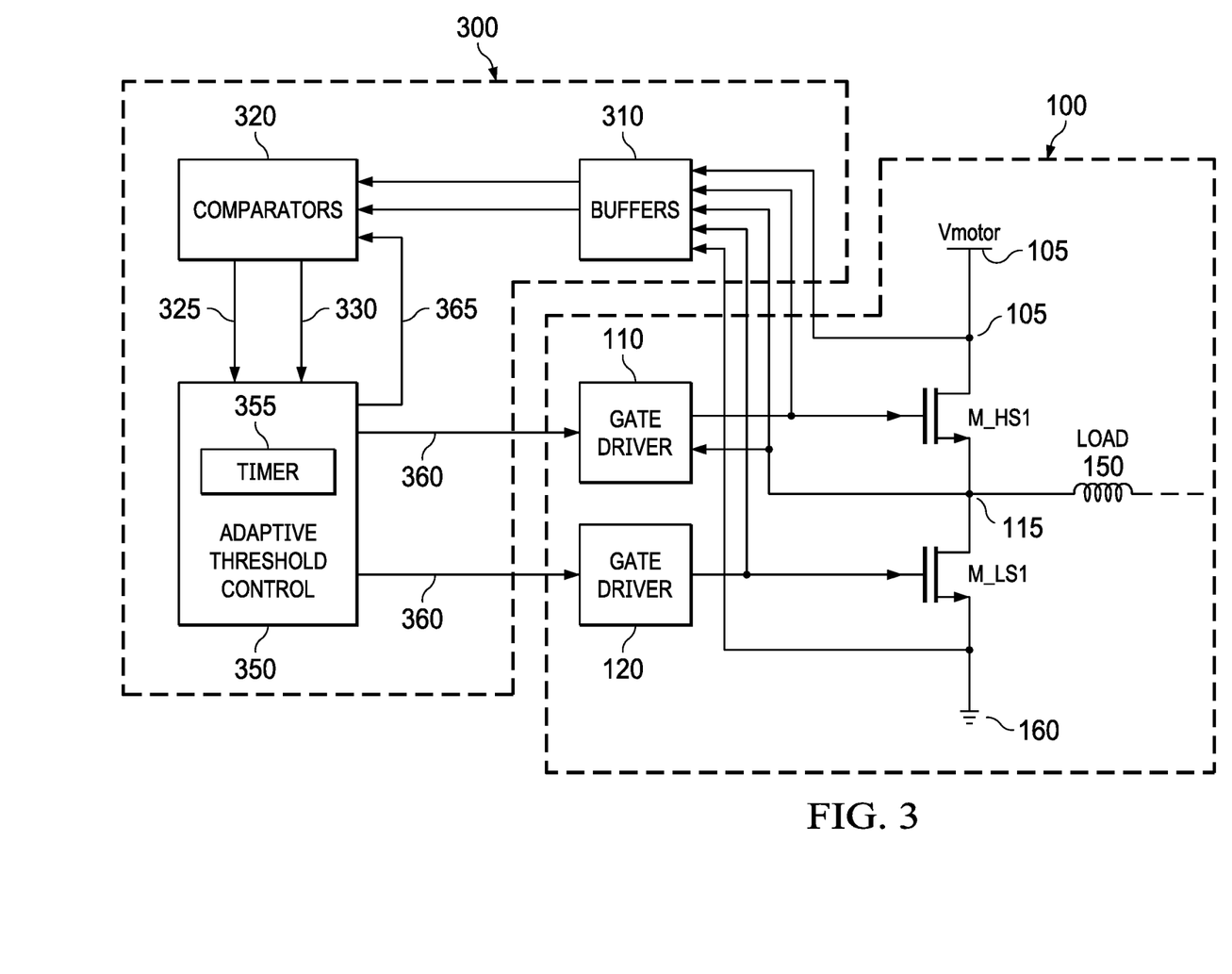
FIG. 3 illustrates an example adaptive threshold control system.

FIG. 3 illustrates an example adaptive threshold control system 300 for identifying transitions between regions of operation in transistor turn on and turn off for example H bridge motor driver 100 of FIG. 1. The adaptive threshold control system 300 is shown in connection with M_HS1 and M_LS1 and gate driver circuits 110 and 120, but may be used in connection with M_HS2 and M_LS2 and gate driver circuits 130 and 140 as well or in addition. Adaptive threshold control system 300 includes buffers 310, comparators 320, and adaptive threshold control sub-circuit 350. Buffers 310 are coupled to various points in H bridge motor driver 100, such that the gate to source voltages (Vgs) and drain to source voltages (Vds) for both M_HS1 and M_LS1 can be determined. Buffers 310 are coupled to the drain of M_HS1 at node 105, the gate of M_HS1, the source of M_HS1 and the drain of M_LS1 at node 115, the gate of M_LS1, and the source of M_LS1 at node 160. Buffers are used to ensure that adaptive threshold control system 300 does not contribute load to H bridge motor driver 100.

Comparators 320 are coupled to buffers 310, and receive the Vgs and Vds for M_HS1 and M_LS1. Comparators 320 compare the Vgs to an adaptive threshold voltage Vth, and the Vds to a crossing threshold Vcrossing. The value of Vth is adjustable based on a control signal from adaptive threshold control sub-circuit 350. The value of crossing threshold Vcrossing represents a voltage change in the Vds indicating the transistor has transitioned from one region of operation to another during turn on and turn off. Adaptive threshold control sub-circuit 350 is coupled to comparators 320, and receives the results of the comparisons between Vgs and Vth and between Vds and Vcrossing. Adaptive threshold control sub-circuit 350 includes a timer 355, which determines a length of time between Vgs crossing Vth and Vds crossing Vcrossing.

Adaptive threshold control sub-circuit 350 compares the determined length of time to a value programmed by a user indicating the length of time a particular gate current is to be applied. If the determined length of time is greater than or less than the programmed value, adaptive threshold control sub-circuit 350 generates and sends a control signal to comparators 320, indicating an adjustment to adaptive threshold voltage Vth. This allows adaptive threshold control system 300 to adjust to changes in system parameters over time, for example as the FET temperature increases. Adaptive threshold control sub-circuit 350 also generates control signals for gate drivers 110 and 120 indicating a drive current to be applied to the gates M_HS1 and M_LS1. As discussed previously with reference to FIG. 2, M_HS1 and M_LS1 are not both on at the same time, so adaptive threshold control system 300 receives values for only one of M_HS1 and M_LS1 at a time. This allows adaptive threshold control system 300 to implement unique comparisons and control signals for each of M_HS1 and M_LS1 and for turn on and turn off, which will be discussed further with reference to FIGS. 4-7.

Figure 4:
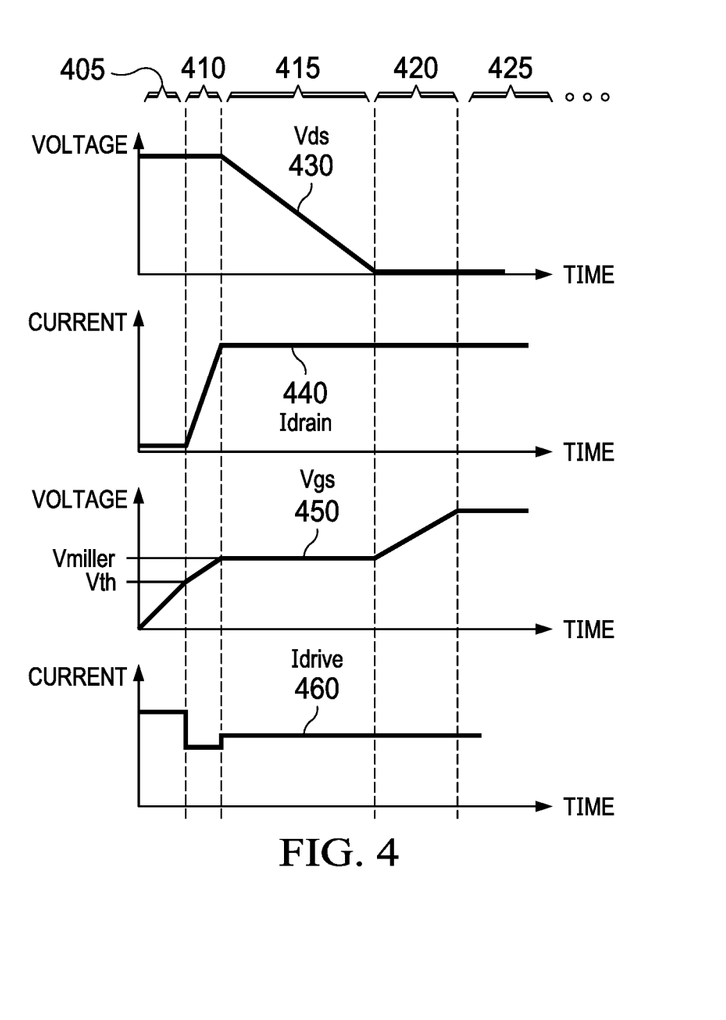

FIG. 4 shows the drain to source voltage (Vds) of a low side transistor M_LS1 in example H bridge motor driver 100 in FIG. 1, the drain current (Idrain) through M_LS1, the gate to source voltage (Vgs) of M_LS1, and the drive current (Idrive) applied to the gate of M_LS1 during transistor turn on. Region 405 is the transistor turn-on region, in which the gate to source capacitance Cgs of M_LS1 is charged to the threshold voltage Vth. When Vgs 450 is greater than Vth, the transistor conducts current and Idrain 440 begins to increase. The length of region 405 is dependent on the drive current Idrive and the threshold voltage Vth, which can vary based on systems parameters such as temperature, battery supply voltage, etc.

Region 410 is the dIdt region, in which Idrain 440 increases and Vgs 450 increases to the Miller voltage (Vmiller). The length of time in dIdt region 410 is dependent on the drive current Idrive and the load 150 on H bridge motor driver 100. The change in Idrain 440 in region 410 can cause EMI or ringing in other circuits on the IC including H-bridge driver 100, and so the value of Idrive, the rate of increase in Vgs 450, and the rate of increase in Idrain 440 are chosen to keep any EMI or ringing produced in region 410 within acceptable limits for the particular implementation. Region 415 is known as the Miller region, in which Vgs 450 remains constant and Vds 430 decreases as Cgd is charged. Once Cgd is charged, the conducting channel of M_LS1 is fully enhanced by increasing Vgs 450 to the on voltage of the transistor in region 420, known as the RDSON enhancement region. Once Vgs 450 reaches the on voltage of the transistor and enters region 425, M_LS1 is in an on state.

Because the gate driver must balance system efficiency and the EMI and ringing limitations of the IC, it is helpful to vary the drive current Idrive based on the region of operation M_LS1 is in. For example, decreasing Idrive during region 410 reduces EMI and increasing it during regions 415 and 420 speeds transistor turn on and increases efficiency. This requires determining which region of operation M_LS1 is in and what EMI and ringing limitations are presents in the IC. Adaptive threshold control system 300 allows a user to program a value of the drive current Idrive 460 for region 410 and a length of time for the user-programmed value of Idrive 460 to be applied, based on the EMI and ringing requirements of the IC.

Based on the transistor's advertised threshold voltage, and the user-programmed values for Idrive 460 and the length of time for it to be applied, adaptive threshold control system 300 estimates an initial value for adaptive threshold voltage Vth. Comparators 320 then compare the value of Vgs 450 from buffers 310 to the initial value for adaptive threshold voltage Vth, and in response to Vgs 450 increasing above the value for Vth, provides a first trigger signal 325 to adaptive threshold control sub-circuit 350. In response to receiving trigger signal 325, adaptive threshold control sub-circuit 350 generates a control signal 360 and provides it to gate driver 120, indicating that the drive current produced by gate driver 120 for M_LS1 should be changed to the user-programmed value for Idrive 460 during region 410.

Comparators 320 also compare the value of Vds 430 from buffers 310 to Vcrossing, which for M_LS1 turn on represents the transition point between regions 410 and 415, during which Vds 430 decreases. In response to Vds 430 decreasing below Vcrossing, comparators 320 provide a second trigger signal 330 to adaptive threshold control sub-circuit 350. In response to receiving trigger signal 330, adaptive threshold control sub-circuit 350 generates a control signal 360 and provides it to gate driver 120, indicating that the drive current produced by gate driver 120 for M_LS1 should be changed to a new value of Idrive 460 during regions 415 and 420.

Adaptive threshold control sub-circuit 350 also causes timer 355 to determine a time between receiving first trigger signal 325 and receiving second trigger signal 330. In response to the determined time between first trigger 325 and second trigger 330 being greater than the user-programmed length of time, adaptive threshold control sub-circuit 350 generates a control signal 365 for comparators 320 to increase the adaptive threshold voltage Vth. This allows the higher drive current Idrive 460 during turn on region 405 to be maintained for a longer period of time before transitioning to the lower Idrive 460 for dIdt region 410. In response to the determined time between first trigger 325 and second trigger 330 being less than the user-programmed length of time, adaptive threshold control sub-circuit 350 generates a control signal 365 for comparators 320 to decrease the adaptive threshold voltage Vth. This decreases the time period for higher Idrive 460 during region 405 and speeds transition to the lower Idrive 460 for dIdt region 410. In this way, adaptive threshold control system 300 adapts to changes in system parameters such as temperature and supply voltage without requiring manual retuning.

Figure 5:
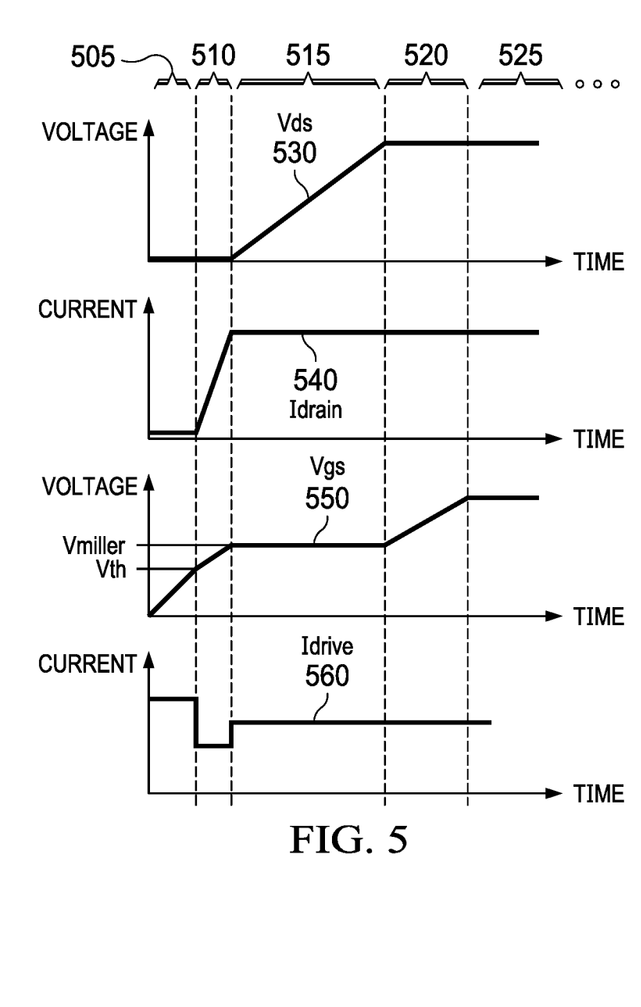

FIG. 5 shows the drain to source voltage (Vds) of a high side transistor M_HS1 in example H bridge motor driver 100 in FIG. 1, the drain current (Idrain) M_HS1, the gate to source voltage (Vgs) of M_HS1, and the drive current (Idrive) applied to the gate of M_HS1 during transistor turn on. Turn on of M_HS1 and regions 505-525 are similar to turn on of M_LS1 and regions 405-425, although Vds 530 for M_HS1 increases during transistor turn on while Vds 430 for M_LS1 decreases during transistor turn on. Because the gate driver must balance system efficiency and the EMI and ringing limitations of the IC, it is helpful to vary the drive current Idrive based on the region of operation M_HS1 is in. Adaptive threshold control system 300 allows a user to program a value of the drive current Idrive 560 for region 510 and a length of time for the user-programmed value of Idrive 560 to be applied based on the EMI and ringing requirements of the IC, just as for M_LS1 turn on.

Based on the transistor's advertised threshold voltage, and the user-programmed values for Idrive 560 and the length of time for it to be applied, adaptive threshold control system 300 estimates an initial value for adaptive threshold voltage Vth. Vcrossing for M_HS1 turn on represents the transition point between regions 510 and 515, during which Vds 530 increases. Adaptive threshold control system 300 then operates as described herein with reference to FIG. 4, comparing the values of Vgs 550 and Vds 530 to the initial value for adaptive threshold voltage Vth and Vcrossing and generating control signal 360 for gate driver 110, indicating changes to Idrive 560 based on the region of operation during transistor turn on.

Adaptive threshold control sub-circuit 350 also causes timer 355 to determine a time between receiving first trigger signal 325 and receiving second trigger signal 330. In response to the determined time between first trigger 325 and second trigger 330 being greater than the user-programmed length of time, adaptive threshold control sub-circuit 350 generates a control signal 365 for comparators 320 to increase the adaptive threshold voltage Vth. This allows the higher drive current Idrive 560 during turn on region 505 to be maintained for a longer period of time before transitioning to the lower Idrive 560 for dIdt region 510. In response to the determined time between first trigger 325 and second trigger 330 being less than the user-programmed length of time, adaptive threshold control sub-circuit 350 generates a control signal 365 for comparators 320 to decrease the adaptive threshold voltage Vth. This decreases the time period for higher Idrive 560 during region 505 and speeds transition to the lower Idrive 560 for dIdt region 510. In this way, adaptive threshold control system 300 adapts to changes in system parameters such as temperature and supply voltage without requiring manual retuning.

Figure 6:
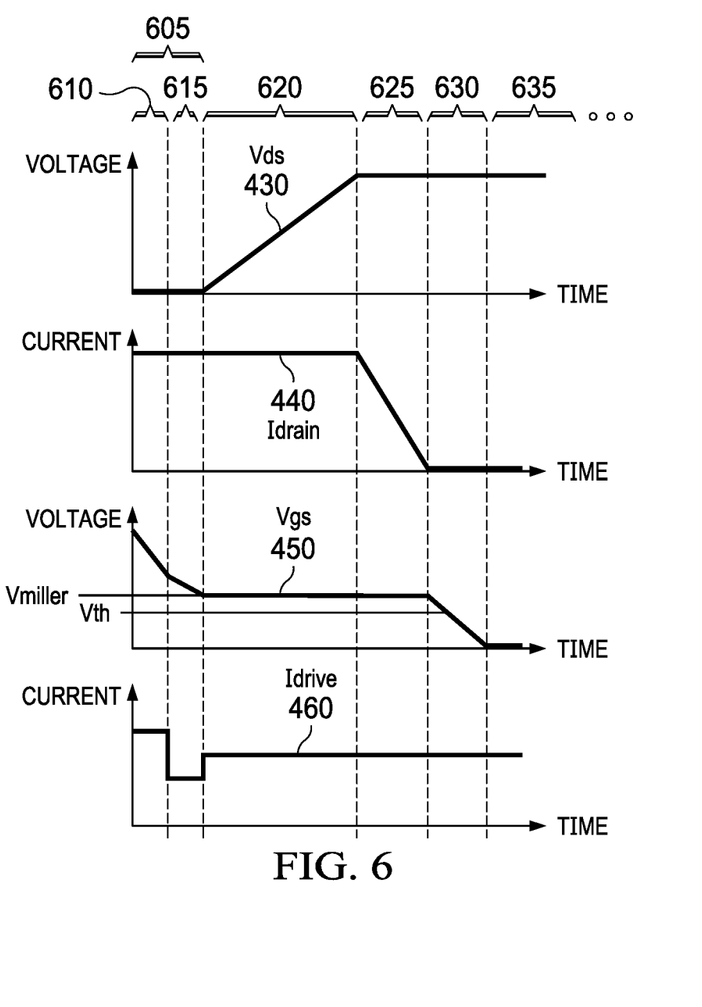
FIG. 6 shows the drain to source voltage of a low side transistor in an example H bridge motor driver, the drain current through the low side transistor, the gate to source voltage of the low side transistor, and the drive current applied to the gate of the low side transistor during transistor turn off.

FIG. 6 shows the drain to source voltage (Vds) of a low side transistor M_LS1 in example H bridge motor driver 100 shown in FIG. 1, the drain current (Idrain) through M_LS1, the gate to source voltage (Vgs) of M_LS1, and the drive current (Idrive) applied to the gate of M_LS1 during transistor turn off. Region 605 is the gate discharge region, during which Vgs 450 decreases as the gate capacitance of M_LS1 is discharged to the Miller plateau level. The gate discharge region is divided into a fast discharge region 610 and a slow discharge region 615. Once the gate voltage reaches the Miller plateau level, Vds 430 increases as Cgd discharges further. As in region 415, region 620 and the increasing Vds 430 can cause EMI and noise in other circuits on the IC. In region 625, the dIdt region, Idrain 440 decreases. In region 630, both Cgs and Cgd are discharged to zero volts, decreasing Vgs 450 to zero volts and turning off the transistor. In region 635, M_LS1 is in an off state.

Because the gate driver must balance system efficiency and the EMI and ringing limitations of the IC, it is helpful to vary the drive current Idrive based on the region of operation M_LS1 is in. For example, increasing Idrive during region 605 speeds transistor turn off and increases efficiency, decreasing it during region 620 reduces EMI. This requires determining which region of operation M_LS1 is in and what EMI and ringing limitations are presents in the IC. Latency in the system in detecting the transition to the Miller region 620 and adjusting Idrive 460 in response to the transition may cause the system to overshoot the transition and cause EMI in region 620 before it is able to reduce Idrive 460 for region 620. Adaptive threshold control system 300 allows a user to divide gate discharge region 605 into a fast discharge region 610 and a slow region 615, slowing the approach to region 620 and giving the system time to detect the transition point and adjust Idrive 460.

Adaptive threshold control system 300 allows a user to program a value of the drive current Idrive 460 for region 615 and a length of time for the user-programmed value of Idrive 460 to be applied based on the EMI and ringing requirements of the IC. Based on the user-programmed values for Idrive 460 and the length of time for it to be applied, adaptive threshold control system 300 estimates an initial value for adaptive transition threshold voltage Vtransition. Comparators 320 then compare the value of Vgs 450 from buffers 310 to the initial value for adaptive transition threshold voltage Vtransition, and in response to Vgs 450 decreasing below the value for Vtransition, provides a first trigger signal 325 to adaptive threshold control sub-circuit 350. In response to receiving trigger signal 325, adaptive threshold control sub-circuit 350 generates a control signal 360 and provides it to gate driver 120, indicating that the drive current produced by gate driver 120 for M_LS1 should be changed to the user-programmed value for Idrive 460 during region 615.

Comparators 320 also compare the value of Vds 430 from buffers 310 to Vcrossing, which for M_LS1 turn off represents the transition point between regions 615 and 620, during which Vds 430 increases. In response to Vds 430 increasing above Vcrossing, comparators 320 provide a second trigger signal 330 to adaptive threshold control sub-circuit 350. In response to receiving trigger signal 330, adaptive threshold control sub-circuit 350 generates a control signal 360 and provides it to gate driver 120, indicating that the drive current produced by gate driver 120 for M_LS1 should be changed to a new value of Idrive 460 during regions 620-630.

Adaptive threshold control sub-circuit 350 also causes timer 355 to determine a time between receiving first trigger signal 325 and receiving second trigger signal 330. In response to the determined time between first trigger 325 and second trigger 330 being greater than the user-programmed length of time, adaptive threshold control sub-circuit 350 generates a control signal 365 for comparators 320 to decrease the adaptive transition threshold voltage Vtransition. This allows the higher Idrive 460 for fast discharge region 610 to be maintained for a longer period of time before transitioning to the lower Idrive 460 for slow discharge region 615. In response to the determined time between first trigger 325 and second trigger 330 being less than the user-programmed length of time, adaptive threshold control sub-circuit 350 generates a control signal 365 for comparators 320 to increase the adaptive transition threshold voltage Vtransition. This decreases the time period for higher Idrive 460 during fast discharge region 610 and speeds transition to the lower Idrive 460 for slow discharge region 615. In this way, adaptive threshold control system 300 adapts to changes in system parameters such as temperature and supply voltage without requiring manual retuning.

Figure 7:
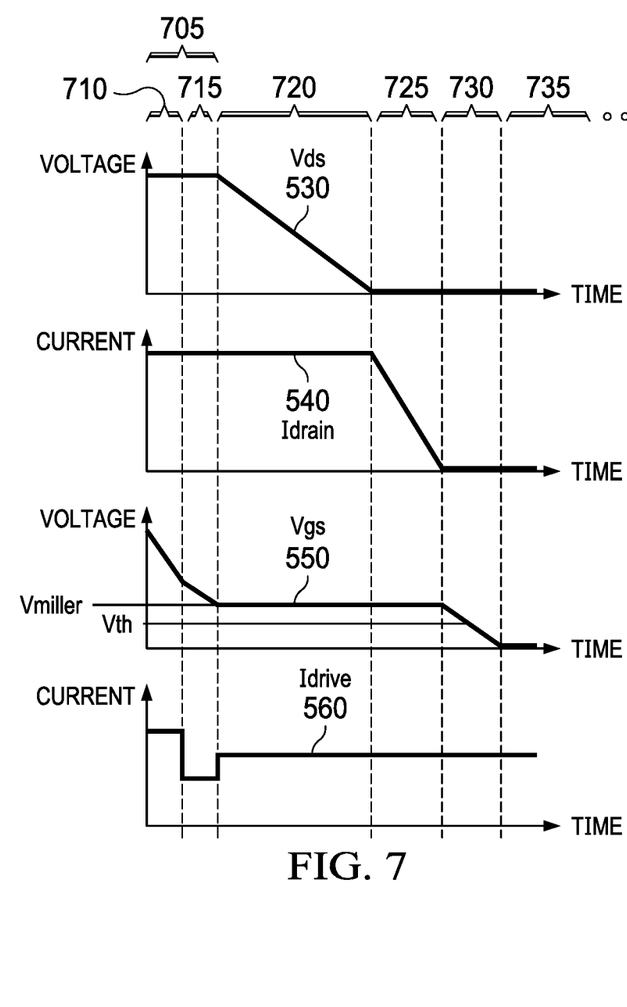
FIG. 7 shows the drain to source voltage of a high side transistor in an example H bridge motor driver, the drain current through the high side transistor, the gate to source voltage of the high side transistor, and the drive current applied to the gate of the high side transistor during transistor turn off.

FIG. 7 shows the drain to source voltage (Vds) of a high side transistor M_HS1 in example H bridge motor driver 100 shown in FIG. 1, the drain current (Idrain) through M_HS1, the gate to source voltage (Vgs) of M_HS1, and the drive current (Idrive) applied to the gate of M_HS1 during transistor turn off. Turn off of M_HS1 and regions 705-730 are similar to turn off of M_LS1 and regions 605-630, although Vds 530 for M_HS1 decreases during transistor turn off while Vds 430 for M_HS1 decreases during transistor turn off. Because the gate driver must balance system efficiency and the EMI and ringing limitations of the IC, it is helpful to vary the drive current Idrive based on the region of operation M_HS1 is in. Latency in the system in detecting the transition to the Miller region 720 and adjusting Idrive 560 in response to the transition may cause the system to overshoot the transition and cause EMI in region 720 before it is able to reduce Idrive 560 for region 720. Adaptive threshold control system 300 allows a user to divide gate discharge region 705 into a fast discharge region 710 and a slow region 715, slowing the approach to region 720 and giving the system time to detect the transition point and adjust Idrive 560.

Adaptive threshold control system 300 allows a user to program a value of the drive current Idrive 560 for region 715 and a length of time for the user-programmed value of Idrive 560 to be applied based on the EMI and ringing requirements of the IC. Based on the user-programmed values for Idrive 560 and the length of time for it to be applied, adaptive threshold control system 300 estimates an initial value for adaptive transition threshold voltage Vtransition. Comparators 320 then compare the value of Vgs 550 from buffers 310 to the initial value for adaptive transition threshold voltage Vtransition, and in response to Vgs 550 decreasing below the value for Vtransition, provides a first trigger signal 325 to adaptive threshold control sub-circuit 350. In response to receiving trigger signal 325, adaptive threshold control sub-circuit 350 generates a control signal 360 and provides it to gate driver 110, indicating that the drive current produced by gate driver 110 for M_HS1 should be changed to the user-programmed value for Idrive 560 during region 715.

Comparators 320 also compare the value of Vds 430 from buffers 310 to Vcrossing, which for M_HS1 turn off represents the transition point between regions 715 and 720, during which Vds 530 decreases. In response to Vds 530 decreasing below Vcrossing, comparators 320 provide a second trigger signal 330 to adaptive threshold control sub-circuit 350. In response to receiving trigger signal 330, adaptive threshold control sub-circuit 350 generates a control signal 360 and provides it to gate driver 110, indicating that the drive current produced by gate driver 110 for M_HS1 should be changed to a new value of Idrive 560 during regions 720-630.

Adaptive threshold control sub-circuit 350 also causes timer 355 to determine a time between receiving first trigger signal 325 and receiving second trigger signal 330. In response to the determined time between first trigger 325 and second trigger 330 being greater than the user-programmed length of time, adaptive threshold control sub-circuit 350 generates a control signal 365 for comparators 320 to decrease the adaptive transition threshold voltage Vtransition. This allows the higher Idrive 560 for fast discharge region 710 to be maintained for a longer period of time before transitioning to the lower Idrive 560 for slow discharge region 715. In response to the determined time between first trigger 325 and second trigger 330 being less than the user-programmed length of time, adaptive threshold control sub-circuit 350 generates a control signal 365 for comparators 320 to increase the adaptive transition threshold voltage Vtransition. This decreases the time period for higher Idrive 560 during fast discharge region 710 and speeds transition to the lower Idrive 560 for slow discharge region 715. In this way, adaptive threshold control system 300 adapts to changes in system parameters such as temperature and supply voltage without requiring manual retuning.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. An adaptive threshold control system, comprising:
  a buffer circuit configured to be coupled to a transistor, such that the buffer circuit receives a first voltage across a control terminal and a first current terminal of the transistor and a second voltage across a second current terminal and the first current terminal of the transistor;
  a comparator circuit coupled to the buffer circuit and configured to:
    compare the first voltage to a first threshold,
    generate a first trigger signal in response to the first voltage crossing the first threshold,
    compare the second voltage to a second threshold, and
    generate a second trigger signal in response to the second voltage crossing the second threshold;
  a timer circuit configured to determine a length of time between the first and second trigger signals; and
  an adaptive threshold control circuit coupled to the comparator circuit and the timer circuit, wherein the adaptive threshold control circuit is configured to:

generate a first control signal in response to the first trigger signal and a second control signal in response to the second trigger signal, provide, to the comparator circuit, a third control signal indicative of whether the length of time is greater than or less than a user-programmed value, wherein the third control signal causes the comparator circuit to adjust the first threshold.

2. The adaptive threshold control system of claim 1, wherein the first and second control signals cause a driver circuit for the transistor to adjust a drive current.

3. The adaptive threshold control system of claim 1, wherein for transistor turn on, the comparator circuit is further configured to:
increase the first threshold in response to the third control signal indicating the length of time is greater than the user-programmed value, and
decrease the first threshold in response to the third control signal indicating the length of time is less than the user-programmed value.

4. The adaptive threshold control system of claim 1, wherein for transistor turn on, the comparator circuit is configured to generate the first trigger signal in response to the first voltage increasing above the first threshold.

5. The adaptive threshold control system of claim 4, wherein the transistor is a low side transistor in a half-bridge circuit, and wherein the comparator circuit is configured to generate the second trigger signal in response to the second voltage decreasing below the second threshold.

6. The adaptive threshold control system of claim 4, wherein the transistor is a high side transistor in a half-bridge circuit, and wherein the comparator circuit is configured to generate the second trigger signal in response to the second voltage increasing above the second threshold.

7. The adaptive threshold control system of claim 1, wherein for transistor turn off, the comparator circuit is further configured to:
decrease the first threshold in response to the third control signal indicating the length of time is greater than the user-programmed value; and
increase the first threshold in response to the third control signal indicating the length of time is less than the user-programmed value.

8. The adaptive threshold control system of claim 1, wherein for transistor turn off, the comparator circuit is configured to generate the first trigger signal in response to the first voltage decreasing below the first threshold.

9. The adaptive threshold control system of claim 8, wherein the transistor is a low side transistor in a half-bridge circuit, and wherein the comparator circuit is configured to generate the second trigger signal in response to the second voltage increasing above the second threshold.

10. The adaptive threshold control system of claim 8, wherein the transistor is a high side transistor in a half-bridge circuit, and wherein the comparator circuit is configured to generate the second trigger signal in response to the second voltage decreasing below the second threshold.

11. A method, comprising:
determining a first voltage across a control terminal and a first current terminal of a transistor and a second voltage across a second current terminal and the first current terminal of the transistor;
determining the first voltage crosses a first threshold;
generating a first control signal in response to determining the first voltage crosses the first threshold;
determining the second voltage crosses a second threshold;
generating a second control signal in response to determining the second voltage crosses the second threshold;
determining a length of time between determining the first voltage crosses the first threshold and determining the second voltage crosses the second threshold;
comparing the length of time to a user-programmed value; and
adjusting the first threshold based on the comparison.

12. The method of claim 11, wherein the first and second control signals cause a driver circuit for the transistor to adjust a drive current generated by the driver circuit.

13. The method of claim 11, wherein for transistor turn on, adjusting the first threshold based on the comparison comprises:
increasing the first threshold in response to the length of time being greater than the user-programmed value; and
decreasing the first threshold in response to the length of time being less than the user-programmed value.

14. The method of claim 11, wherein for transistor turn on, determining the first voltage crosses the first threshold comprises determining the first voltage increases above the first threshold.

15. The method of claim 11, wherein for transistor turn off, adjusting the first threshold based on the comparison comprises:
decreasing the first threshold in response to the length of time being greater than the user-programmed value; and
increasing the first threshold in response to the length of time being less than the user-programmed value.

16. The method of claim 11, wherein for transistor turn off, determining the first voltage crosses the first threshold comprises determining the first voltage decreases below the first threshold.

17. A device, comprising:
a half-bridge circuit comprising a transistor, wherein the transistor comprises a control terminal, a first current terminal, and a second current terminal;
a driver circuit coupled to the control terminal of the transistor and configured to generate a drive current;
a buffer circuit coupled to the transistor, such that the buffer circuit receives a first voltage across the control terminal and the first current terminal of the transistor and a second voltage across the second current terminal and the first current terminal of the transistor;
a comparator circuit coupled to the buffer circuit and configured to generate a first trigger signal and a second trigger signal;
a timer circuit configured to determine a length of time between the first trigger signal and the second trigger signal; and
an adaptive threshold control circuit coupled to the comparator circuit and the timer circuit, wherein the adaptive threshold control circuit is configured to:
provide, to the driver circuit, a first control signal in response to the first trigger signal and a second control signal in response to the second trigger signal, and
provide, to the comparator circuit, a third control signal indicative of whether the length of time is greater than or less than a user-programmed value.

18. The device of claim 17, wherein the driver circuit is configured to adjust the drive current in response to the first and second control signals.

19. The device of claim 17, wherein the comparator circuit is further configured to:
   compare the first voltage to a first threshold,
   generate the first trigger signal in response to the first voltage crossing the first threshold,
   compare the second voltage to a second threshold, and
   generate the second trigger signal in response to the second voltage crossing the second threshold.

20. The device of claim 19, wherein for transistor turn on, the comparator circuit is configured to generate the first trigger signal in response to the first voltage increasing above the first threshold, and wherein the comparator circuit is further configured to:
   increase the first threshold in response to the third control signal indicating the length of time is greater than the user-programmed value; and
   decrease the first threshold in response to the third control signal indicating the length of time is less than the user-programmed value.

21. The device of claim 19, wherein for transistor turn off, the comparator circuit is configured to generate the first control signal in response to the first voltage decreasing below the first threshold, and wherein the comparator circuit is further configured to:
   decrease the first threshold in response to the third control signal indicating the length of time is greater than the user-programmed value; and
   increase the first threshold in response to the third control signal indicating the length of time is less than the user-programmed value.

* * * * *